United States Patent
Au et al.

(10) Patent No.: US 9,392,713 B2
(45) Date of Patent: Jul. 12, 2016

(54) LOW COST HIGH STRENGTH SURFACE MOUNT PACKAGE

(71) Applicant: RSM Electron Power, Inc., Deer Park, NY (US)

(72) Inventors: Ching Au, Port Washington, NY (US); Dennis Zegzula, East Patchogue, NY (US); David Peng, Flushing, NY (US)

(73) Assignee: RSM Electron Power, Inc., Deer Park, NY (US)

( * ) Notice: Subject to any disclaimer, the term of this patent is extended or adjusted under 35 U.S.C. 154(b) by 51 days.

(21) Appl. No.: 14/573,631

(22) Filed: Dec. 17, 2014

(65) Prior Publication Data

US 2016/0113138 A1    Apr. 21, 2016

Related U.S. Application Data

(60) Provisional application No. 62/065,090, filed on Oct. 17, 2014.

(51) Int. Cl.
| | |
|---|---|
| *H01L 23/02* | (2006.01) |
| *H05K 5/06* | (2006.01) |
| *H01L 23/055* | (2006.01) |
| *H05K 1/18* | (2006.01) |
| *H05K 1/02* | (2006.01) |
| *H05K 1/03* | (2006.01) |
| *H05K 1/09* | (2006.01) |
| *H05K 5/03* | (2006.01) |

(52) U.S. Cl.
CPC .............. *H05K 5/066* (2013.01); *H01L 23/055* (2013.01); *H05K 1/0271* (2013.01); *H05K 1/03* (2013.01); *H05K 1/09* (2013.01); *H05K 1/181* (2013.01); *H05K 5/03* (2013.01)

(58) Field of Classification Search
CPC . H01L 21/52; H01L 27/14618; H01L 25/165; H01L 23/5389; H01L 2224/32225; H01L 23/053
USPC .......................... 257/678, 701, 704, 706, 707
See application file for complete search history.

(56) References Cited

U.S. PATENT DOCUMENTS

| | | | |
|---|---|---|---|
| 5,111,277 A | 5/1992 | Medeiros, III et al. | |
| 5,139,972 A * | 8/1992 | Neugebauer ............ | H01L 21/50 257/E21.499 |

(Continued)

FOREIGN PATENT DOCUMENTS

WO    96/30942 A1    10/1996

OTHER PUBLICATIONS

Notification of Transmittal of the International Search Report and the Written Opinion dated Jan. 18, 2016, in related PCT Application No. PCT/US2015/055655.

*Primary Examiner* — S. V. Clark
(74) *Attorney, Agent, or Firm* — Fitzpatrick, Cella, Harper & Scinto

(57) ABSTRACT

A hermetically sealed package has an electrically insulating substrate, a plurality of electrically and thermally conductive tabs, and a lid. The electrically insulating substrate has a plurality of apertures and an aspect ratio of about 10:1 or greater. The plurality of electrically and thermally conductive tabs is hermetically joined to a bottom surface of the electrically insulating substrate and at least one tab covers each of the apertures. The lid is hermetically joined to a top surface of the electrically insulating substrate proximate to a perimeter of the electrically insulating substrate.

20 Claims, 4 Drawing Sheets

(56) References Cited

U.S. PATENT DOCUMENTS

| | | | |
|---|---|---|---|
| 5,188,985 A | 2/1993 | Medeiros, III et al. | |
| 6,145,380 A * | 11/2000 | MacGugan | G01P 15/097 73/493 |
| 2008/0230890 A1 | 9/2008 | Ueda | |
| 2009/0214207 A1 * | 8/2009 | Duricic | G02B 6/2931 398/50 |
| 2010/0013084 A1 | 1/2010 | Medeiros, III | |
| 2010/0270669 A1 | 10/2010 | Medeiros, III | |
| 2013/0099369 A1 | 4/2013 | Shimane et al. | |
| 2013/0279136 A1 * | 10/2013 | Sato | G01C 19/5783 361/774 |

* cited by examiner

LOW COST HIGH STRENGTH SURFACE MOUNT PACKAGE

CROSS-REFERENCE TO RELATED APPLICATION

This application claims the benefit under 35 U.S.C. §119 (e) of U.S. Provisional Patent Application No. 62/065,090, filed Oct. 17, 2014, and titled "Low Cost High Strength Surface Mount Package." The foregoing application is hereby incorporated by reference in its entirety and is made a part of this specification for all that it discloses.

FIELD OF THE INVENTION

This invention relates to a surface-mount package for a semiconductor device and, in particular, a hermetically sealed surface-mount package.

BACKGROUND OF THE INVENTION

Surface-mounted semiconductors are used in a wide variety of applications. In some of these applications, it is necessary to protect the semiconductor from environmental factors that could degrade its performance. Hermetically sealed surface mount packages are used to protect the semiconductor from such environmental factors. In some of these applications, the hermetically sealed semiconductor package may be exposed to extreme conditions, such as extreme temperatures, large temperature transients, shock, and the like. Such applications may include, for example, military, space, aerospace, and down hole drilling applications. There is thus a need for a hermetically sealed surface-mount package that can reliably be used in such extreme applications.

SUMMARY OF THE INVENTION

In one aspect, the invention relates to a hermetically sealed package having an electrically insulating substrate, a plurality of electrically and thermally conductive tabs, and a lid. The electrically insulating substrate has a plurality of apertures and an aspect ratio of about 10:1 or greater. The plurality of electrically and thermally conductive tabs is hermetically joined to a bottom surface of the electrically insulating substrate and at least one tab covers each of the apertures. The lid is hermetically joined to a top surface of the electrically insulating substrate proximate a perimeter of the electrically insulating substrate.

In another aspect, the invention relates to a hermetically sealed package having an electrically insulating substrate having a plurality of apertures. A plurality of metallization layers are formed on a bottom surface of the electrically insulating substrate, with one of the metallization layers proximate a perimeter of each of the plurality of apertures. Each of the plurality of metallization layers has a width of at least about 10 mils. The hermetically sealed package also has a plurality of electrically and thermally conductive tabs, with at least one tab covering each of the apertures and joined to the attachment layer corresponding to the aperture covered by the tab. A frame-like metallization layer is formed on a top surface of the electrically insulating substrate, is proximate the perimeter of the electrically insulating substrate, and has a width of at least about 15 mils. A lid is joined to the frame-like metallization layer.

In yet another aspect, the invention relates to a hermetically sealed package having an electrically insulating substrate having a plurality of apertures. A plurality of metallization layers are formed on a bottom surface of the electrically insulating substrate, with one of the metallization layers proximate a perimeter of each of the plurality of apertures. The hermetically sealed package also has a plurality of electrically and thermally conductive tabs, with at least one tab covering each of the apertures and joined to the attachment layer corresponding to the aperture covered by the tab. A frame-like metallization layer is formed on a top surface of the electrically insulating substrate proximate the perimeter of the electrically insulating substrate. The hermetically sealed package also has a formed lid with a generally L-shaped perimeter. A portion of the perimeter of the lid is generally parallel to the top surface of the electrically insulating substrate and is joined to the frame-like metallization layer.

DETAILED DESCRIPTION OF THE PREFERRED EMBODIMENTS

Figure 1:
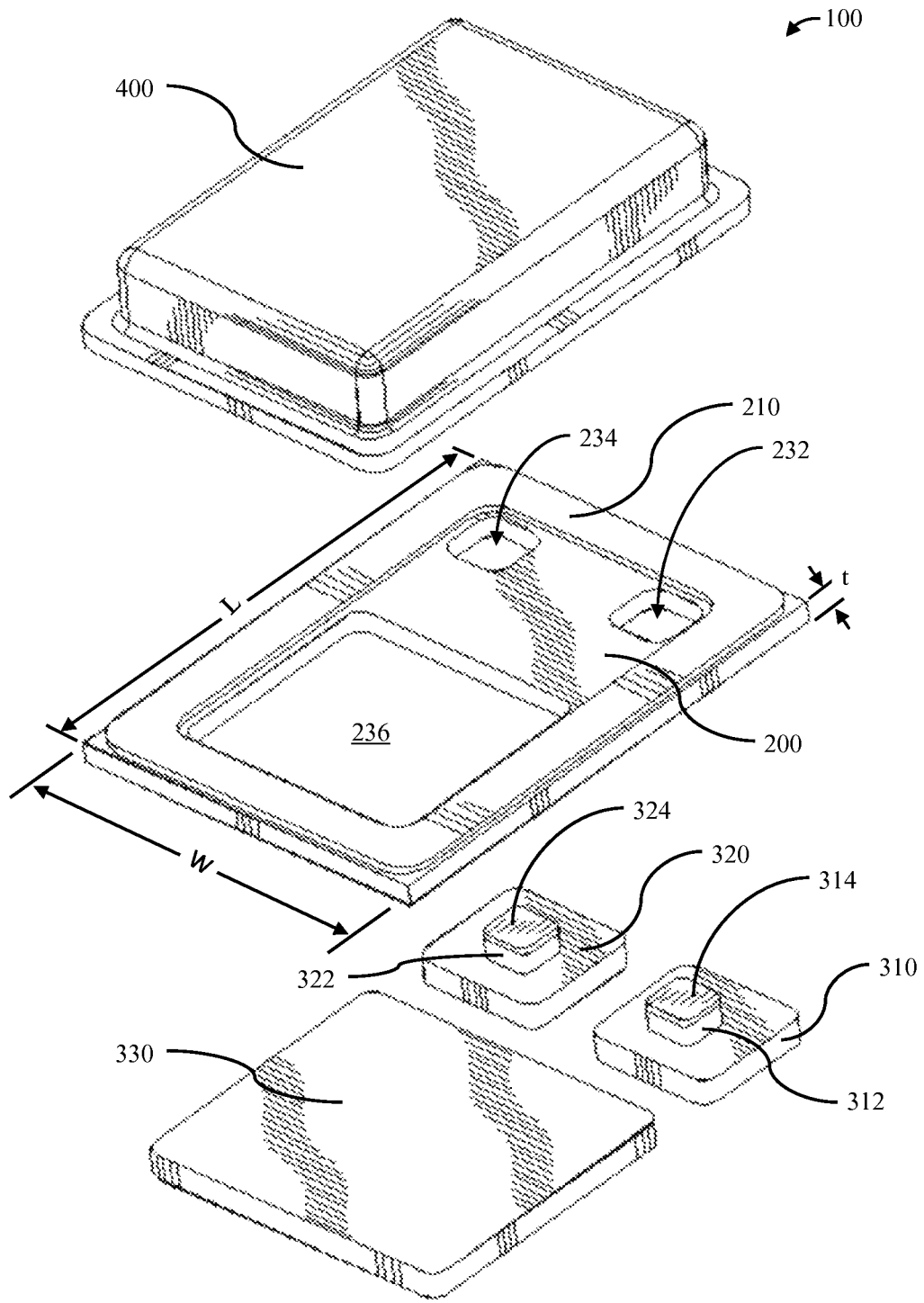
FIG. 1 shows an exploded perspective view of a hermetically sealed package according to a preferred embodiment invention.

Exemplary preferred embodiments of the invention will now be described with reference to the accompanying figures. Like reference numerals refer to the same or similar elements throughout the figures and description.

Figure 2:
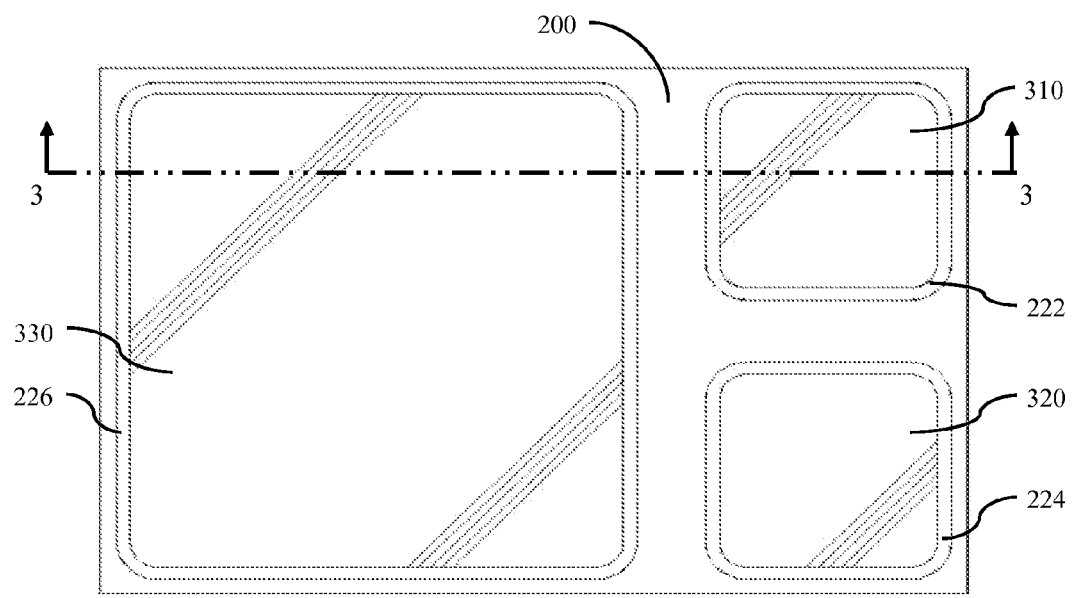
FIG. 2 shows a bottom view of the hermetically sealed package shown in FIG. 1.
Figure 3:
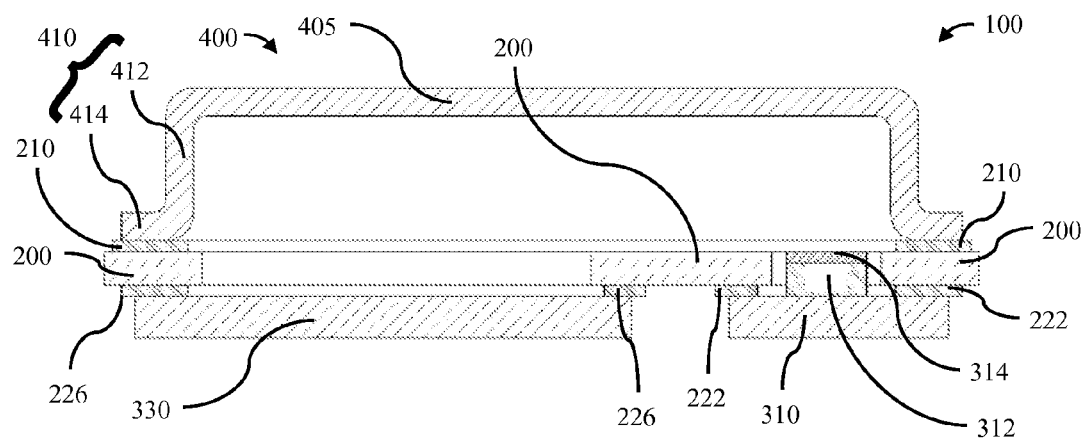
FIG. 3 is a cross-section view of a portion of the hermetically sealed package in FIG. 2 taken along line 3-3.

FIG. 1 shows an exploded view of a hermetically sealed surface-mount package 100 according to a preferred embodiment of the invention. FIG. 2 is a bottom view of the package 100, and FIG. 3 is a cross-section view of the package 100 taken along line 3-3 in FIG. 2. In this embodiment, the package 100 includes an electrically insulating substrate 200; solder tabs 310, 320, 330; and a lid 400. The package 100 of the current embodiment is designed for reliable use in extreme conditions. The package 100 of this embodiment can also be quickly and efficiently manufactured with a large number of packages in each batch.

The substrate 200 of this embodiment is an electrically insulating substrate that is designed to withstand extreme conditions. Preferably, the electrically insulating substrate 200 will be a ceramic, although other suitable materials such as glass, plastic, and composite materials may be used. To withstand such extreme conditions, the ceramic electrically insulating substrate 200 preferably has a flexural strength greater than about 600 MPa and more preferably greater than about 750 MPa. Flexural strength is preferably determined using ASTM C1161-13, Standard Test Method for Flexural Strength of Advanced Ceramics at Ambient Temperature. In addition, the electrically insulating substrate 200 preferably has a thermal conductivity that exceeds about 70 W/mK.

Furthermore, the electrically insulating substrate 200 should be non-permeable in order to provide a boundary of the hermetically sealed package 100. The coefficient of thermal expansion for the substrate 200 and a semiconductor device 500 (see FIG. 5) are preferably similar in order to minimize thermal stresses resulting from manufacturing and the application environment, particularly extreme conditions. Thus, the coefficient of thermal expansion of the substrate 200 is preferably from about 3 ppm/° C. to about 10 ppm/° C. The inventors have found that a suitable substrate 200 which meets these preferable ranges comprises silicon nitride ($Si_3N_4$). One advantage of the high flexural strength substrate 200, such as silicon nitride, is that the thickness t of substrate 200 can be made relatively thin, particularly in reference to a dimension perpendicular to its thickness such as length L and width W, and still accommodate the stresses present during use and/or manufacturing. Preferably the substrate 200 has a thickness t from about 8 mils to about 25 mils, and more preferably from about 10 mils to about 15 mils. Alternatively, the preferred thickness may also be quantified in terms of an aspect ratio, that is, a ratio of a dimension perpendicular to the thickness t of the substrate 200 (e.g., length L or width W) to the thickness t of the substrate 200. Preferably, the aspect ratio (e.g., L to t) is about 10:1 or greater, and more preferably about 12:1 or greater.

Substrate 200 of the preferred embodiment is a metallized substrate having patterned metal layers bonded to both the top and bottom surface of the substrate 200. These metallization layers 210, 222, 224, 226 form a hermetic seal between the substrate 200 and the lid 400 and between the substrate 200 and the solder tabs 310, 320, 330.

The top metallization layer 210 is formed around the perimeter of the top surface of the substrate 200 in a frame-like manner. The top metallization layer 210 is used to connect the lid 400 to the substrate 200 and may be formed by any suitable method known in the art such as direct bonding, direct plating, active metal brazing, and the like. The top metallization layer 210 is preferably an electrically and thermally conductive material. Although any suitable material may be used, the top metallization layer 210 comprises copper in this embodiment. The thickness of the top metallization layer 210 is preferably from about 0.5 mil to about 12 mils.

The top metallization layer 210 may also be plated with another metal such as nickel, silver, or gold in order to promote the wettability of the top metallization layer 210 for the subsequent processes used to attach the lid 400 to the substrate, as will be discussed below. A second plating layer may also be applied after the first. For example, the first plating layer may comprise nickel and a second plating layer may be applied comprising silver or gold. The thickness of each plating layer is preferably from about 0.005 mil to about 0.5 mil.

The substrate 200 also has a plurality of apertures: a first aperture 232, a second aperture 234, and a third aperture 236. In this embodiment, the third aperture 236 is used to attach a semiconductor device 500 (see FIG. 5). The first and second apertures 232, 234 are used to create electrical connections to the semiconductor device 500.

The patterned metallization layer formed on the bottom surface of the substrate 200 includes a first bottom metallization layer 222 formed around the perimeter of the first aperture 232, a second bottom metallization layer 224 formed around the perimeter of the second aperture 234, and a third bottom metallization layer 226 formed around the perimeter of the third aperture 236. As with the top metallization layer 210, the bottom metallization layers 222, 224, 226 are preferably formed of electrically and thermally conductive materials such as copper. Similarly to the top metallization layer 210, the bottom metallization layers 222, 224, 226 may be formed by any suitable method and may also have additional metal layers applied thereon. As with the top metallization layer 210, the bottom metallization layers 222, 224, 226 preferably have a thickness from about 0.5 mil to about 12 mils, and a thickness of each plating layer from about 0.005 mil to about 0.5 mil.

The first, second, and third solder tabs 310, 320, 330 are respectively joined to the first bottom metallization layer 222, the second bottom metallization layer 224, and the third bottom metallization layer 226. The first solder tab 310 seals the first aperture 232. The second solder tab 320 seals the second aperture 234. And the third solder tab 330 seals the third aperture 236.

The solder tabs 310, 320, 330 are preferably formed from a thermally conductive material that has a low electrical resistivity. Any suitable material known in the art may be used; however, to avoid stress being generated at the joint where the solder tabs 310, 320, 330 are joined to the first, second, and third bottom metallization layers 222, 224, 226, the solder tabs 310, 320, 330 preferably comprise a material having a similar coefficient of thermal expansion to the substrate 200. In this way, stresses that result from temperature changes can be minimized.

Preferably, the difference in coefficient of thermal expansion between the solder tabs 310, 320, 330 and the substrate 200 is within about 7 ppm/° C., and more preferably within about 5 ppm/° C. Suitable materials include metals comprising molybdenum, tungsten, or copper. In this embodiment, the solder tabs 310, 320, 330 are joined to the bottom metallization layers 222, 224, 226 by brazing or soldering, although any suitable method may be used to form a hermetic joint. The width of each bottom metallization layer 222, 224, 226 is preferably similar to the width of the top metallization layer 210 for the reasons discussed below relative to forming a hermetic seal between the lid 400 and the substrate 200.

Figure 5:
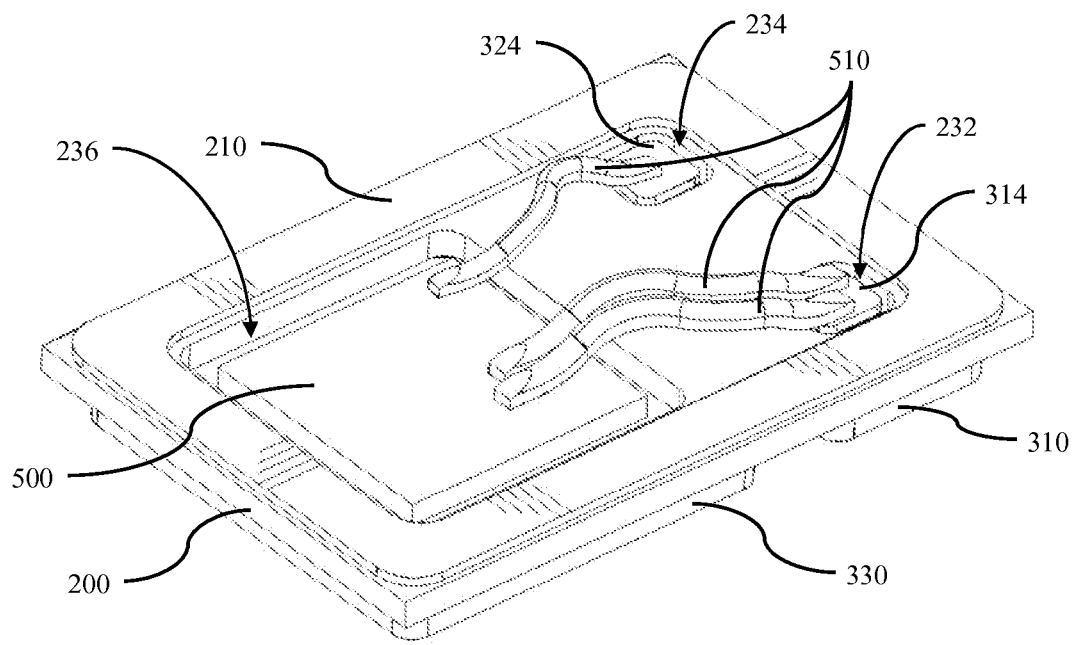
FIG. 5 is perspective view of the hermetically sealed package of the preferred embodiment shown in FIG. 1 without the lid and showing a semiconductor chip wirebonded to the package.
Figure 6:
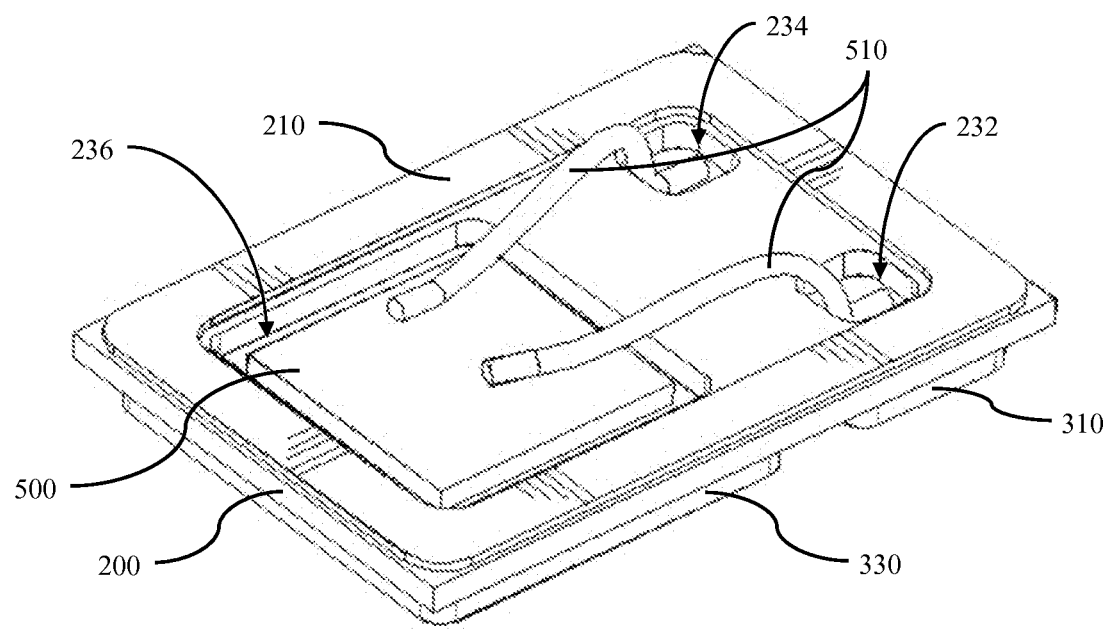
FIG. 6 is perspective view of a hermetically sealed package according to a preferred embodiment invention without the lid and showing an alternate semiconductor chip wirebond configuration.

As shown in FIGS. 5 and 6, a semiconductor device 500 is bonded to the top side of the third solder tab 330. The third solder tab 330 may thus provide an electrical connection from the inside of the package 100 to the outside of the package 100. In addition, the third solder tab 330 also provides for heat dissipation away from the semiconductor device 500. The first and second solder tabs 310, 320 may be used for electrical connection to the semiconductor device 500. These tabs 310, 320 are connected to the semiconductor device 500 through the use of wirebonds 510.

In the embodiment shown in FIGS. 1 through 5, a first pedestal 312 is attached to the first tab 310, and a second pedestal 322 is attached to the second tab 320. These pedestals 312, 322 aid in the attachment of the wirebonds 510 to the first and second solder tabs 310, 320 by raising the point where the wirebonds 510 are electrically attached to be about the same height as the top surface of the substrate 200. Accordingly, the height of the pedestal 312, 322 is preferably about the same as the thickness of the substrate 200. While any suitable material may be used to form the first and second pedestals 312, 322, they are preferably formed from a low resistivity metal such as copper.

In the present embodiment, the first and second pedestals 312, 322 are joined to the first and second solder tabs 310, 320, respectively, by soldering, although any suitable method may be used including, for example, integrally forming the pedestal and solder tab. On a top surface of each pedestal 312, 322 a compatible metallic layer 314, 324 is preferably applied to provide a highly reliable surface to bond the wirebonds 510 to the pedestals 312, 322. The compatible metallic layer may be formed on the pedestal 312, 322 using any suitable method known in the art including, for example, cladding or plating.

When the metal used for the wirebond 510 differs from the surface where the wirebond 510 attaches to the pedestal 312, 322, there is a possibility of defect formation, such as the formation of intermetallics and Kirkendall voids during the soldering or brazing process. Failure of these bond joints, and resultant failure of the semiconductor device, may occur as a result of these defects, particularly at temperatures above about 150° C. As a result, the inventors have found that it is preferable to clad or plate the surface where the wirebond 510 is attached to the pedestal 312, 322 with the compatible metallic layer 314, 324 comprising a compatible material, which does not result in these defects. When the wirebonds 510 are made from aluminum, for example, the pedestals are preferably clad with a thin layer of aluminum. In another example, the compatible metallic layer 314, 324 may be nickel or gold. Nickel or gold may be used, for example, when the wirebonds are made from gold or cooper. The compatible metallic layer 314, 324 is preferably between about 0.05 mil thick to about 3 mils thick.

In an alternate embodiment shown in FIG. 6, the wirebonds 510 may be joined directly to the first and second solder tabs 310, 320. The top surface of the solder tabs 310, 320 may also be suitably clad or plated with a compatible metallic layer similarly to the compatible metallic layer 314 of the first pedestal 312 and the compatible metallic layer 324 of the second pedestal 322.

A lid 400 is used to seal the top of the package 100. In this embodiment, the lid is a metallic, formed lid, but the lid may also suitably comprise glass, ceramic, or any other suitable material. As shown in FIGS. 5 and 6, the wirebonds 510 extend above the top surface of the substrate 200. As shown in FIG. 3, a center portion 405 of the lid 400 is raised above the top surface of the substrate 200 in order to accommodate the wirebonds 510. The periphery 410 of the lid 400 is used to raise the center portion 405. In this embodiment, the periphery 410 is integrally formed with the center portion 405. For example, the periphery 410 may be formed by forging, although any other suitable process, including for example machining, may be used. In the embodiment shown in FIGS. 1 and 3, the periphery 410 is generally L-shaped. A riser portion 412 of the periphery 410 is generally perpendicular to the top surface of the substrate 200 and provides clearance to raise the center portion 405, thus avoiding contact with the wirebonds 510. A joining portion 414 of the periphery is generally parallel to the top surface of the electrically insulating substrate 200.

To maintain a hermetic seal of the package 100 during the extreme conditions discussed above it is preferable that the surfaces joining the lid 400 to the substrate 200 be relatively wide. With wide joining surfaces, an inexpensive joining process may be use to establish a hermetic seal. Such a process may be, for example, brazing or soldering as opposed to seam welding. Accordingly, the joining surface of the lid (the joining portion 414 in this embodiment) is preferably from about 10 mils to about 30 mils in width, and more preferably from about 15 mils to about 25 mils in width. As a result, the width of the top metallization layer 210 is preferably about 15 mils or greater to substantially correspond to the joining surface.

Figure 4:
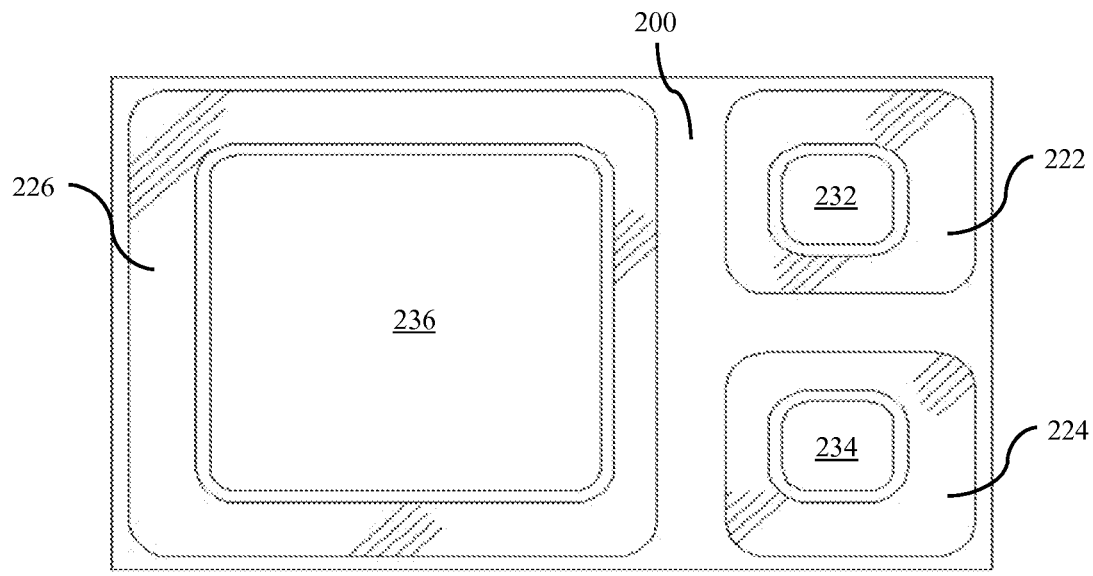
FIG. 4 is a bottom view of a metallized substrate according to the preferred embodiment shown in FIG. 1.

Likewise, it is preferable to also have wide bottom metallization layers 222, 224, 226, allowing a joining portion of each tab 310, 320, 330 to also be wide. The bottom metallization layers 222, 224, 226 may have a variable width. As shown in FIG. 4, for example, the portion of the bottom metallization layer around the perimeter of the substrate 200 is wider than those portions on the interior of the substrate. Preferably, the width of the bottom metallization layers 222, 224, 226 is from about 10 mils to about 30 mils, and the corresponding joining portion of each tab 310, 320, 330 is from about 5 mils wide to about 30 mils.

Specific metals have been discussed herein; alloys of these materials are also contemplated to be within the scope of the invention. Material properties have also been discussed herein, these material properties are at room temperature unless otherwise noted.

The embodiments discussed herein are examples of preferred embodiments of the present invention and are provided for illustrative purposes only. They are not intended to limit the scope of the invention. Although specific configurations, structures, materials, etc. have been shown and described, such are not limiting. Modifications and variations are contemplated within the scope of the invention, which is to be limited only by the scope of the accompanying claims.

What is claimed is:

1. A hermetically sealed package comprising:
   an electrically insulating substrate having a plurality of apertures, the electrically insulating substrate having an aspect ratio of about 10:1 or greater;
   a plurality of electrically and thermally conductive tabs hermetically joined to a bottom surface of the electrically insulating substrate and at least one tab covering each of the apertures; and
   a lid hermetically joined to a top surface of electrically insulating substrate, the lid being joined proximate a perimeter of the electrically insulating substrate.

2. The hermetically sealed package of claim 1, wherein the electrically insulating substrate includes at least one of ceramic, glass, and composite material.

3. The hermetically sealed package of claim 1, wherein the electrically insulating substrate comprises silicon nitride.

4. The hermetically sealed package of claim 1, wherein the electrically insulating substrate is a ceramic having a flexural strength greater than about 750 MPa at room temperature.

5. The hermetically sealed package of claim 1, wherein the electrically insulating substrate and the plurality of conductive tabs have a coefficient of thermal expansion, with the coefficient of thermal expansion of the tabs being within about 5 ppm/° C. of the coefficient of thermal expansion of the electrically insulating substrate.

6. The hermetically sealed package of claim 1, wherein the plurality of tabs comprise at least one of molybdenum, tungsten, and copper.

7. The hermetically sealed package of claim 1, wherein the electrically insulating substrate is from about 10 mils to about 15 mils in thickness.

8. A hermetically sealed package comprising:
   an electrically insulating substrate having a plurality of apertures;
   a plurality of metallization layers formed on a bottom surface of the electrically insulating substrate, with one of the metallization layers proximate a perimeter of each of the plurality of apertures, each of the plurality of metallization layers having a width of at least about 10 mils;
   a plurality of electrically and thermally conductive tabs, at least one tab covering each of the apertures and joined to the attachment layer corresponding to the aperture covered by the tab;
   a frame-like metallization layer formed on a top surface of the electrically insulating substrate, the frame-like metallization layer being proximate the perimeter of the electrically insulating substrate, the frame-like metallization layer having a width of at least about 15 mils; and
a lid joined to the frame-like metallization layer.

9. The hermetically sealed package of claim 8, wherein the tabs are joined to the corresponding attachment layer by brazing or soldering.

10. The hermetically sealed package of claim 8, wherein the lid is joined to the frame-like metallization layer by brazing or soldering.

11. The hermetically sealed package of claim 8, wherein the plurality of metallization layers comprises copper.

12. The hermetically sealed package of claim 11, wherein the plurality of metallization layers has a first plating layer comprising nickel.

13. The hermetically sealed package of claim 12, wherein the plurality of metallization layers has a second plating layer, applied after the first plating layer, comprising at least one of gold and silver.

14. The hermetically sealed package of claim 8, wherein the frame-like metallization layer comprises copper.

15. The hermetically sealed package of claim 14, wherein the frame-like metallization layer has a first plating layer comprising nickel.

16. The hermetically sealed package of claim 15, wherein the frame-like metallization layer has a second plating layer, applied after the first plating layer, comprising at least one of gold and silver.

17. The hermetically sealed package of claim 8, further comprising at least one pedestal soldered to a top surface of at least one tab, the pedestal extending into the aperture covered by the at least one tab.

18. The hermetically sealed package of claim 17, further comprising a semiconductor device and a wire, the wire bonded to the pedestal and the semiconductor device.

19. The hermetically sealed package of claim 18, wherein the wire comprises aluminum, and wherein the pedestal comprises copper and has a compatible metallic layer comprising aluminum.

20. A hermetically sealed package comprising:
an electrically insulating substrate having a plurality of apertures;
a plurality of metallization layers formed on a bottom surface of the electrically insulating substrate, with one of the metallization layers proximate a perimeter of each of the plurality of apertures;
a plurality of electrically and thermally conductive tabs, at least one tab covering each of the apertures and joined to the attachment layer corresponding to the aperture covered by the tab;
a frame-like metallization layer formed on a top surface of the electrically insulating substrate, the frame-like metallization layer being proximate the perimeter of the electrically insulating substrate; and
a formed lid having a generally L-shaped perimeter, with a portion of the perimeter being generally parallel to the top surface of the electrically insulating substrate, the generally parallel portion of the lid being joined to the frame-like metallization layer.

* * * * *